United States Patent
Nishibayashi et al.

(10) Patent No.: US 10,316,430 B2
(45) Date of Patent: Jun. 11, 2019

(54) SINGLE CRYSTAL DIAMOND, METHOD FOR MANUFACTURING SINGLE CRYSTAL DIAMOND, AND TOOL CONTAINING SINGLE CRYSTAL DIAMOND

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Natsuo Tatsumi, Itami (JP); Hitoshi Sumiya, Itami (JP); Akihiko Ueda, Itami (JP); Yutaka Kobayashi, Itami (JP)

(73) Assignees: SUMITOMO ELECTRIC INDUSTRIES, LTD., Osaka-Shi (JP); SUMITOMO ELECTRIC HARDMETAL CORP., Itami-Shi (JP)

( * ) Notice: Subject to any disclaimer, the term of this patent is extended or adjusted under 35 U.S.C. 154(b) by 63 days.

(21) Appl. No.: 15/318,742

(22) PCT Filed: Jul. 14, 2015

(86) PCT No.: PCT/JP2015/070135
§ 371 (c)(1),
(2) Date: Dec. 14, 2016

(87) PCT Pub. No.: WO2016/010028
PCT Pub. Date: Jan. 21, 2016

(65) Prior Publication Data
US 2017/0130362 A1  May 11, 2017

(30) Foreign Application Priority Data

Jul. 15, 2014 (JP) .................. 2014-145014

(51) Int. Cl.
| | |
|---|---|
| C30B 29/04 | (2006.01) |
| C30B 25/18 | (2006.01) |
| C30B 25/20 | (2006.01) |
| C01B 32/25 | (2017.01) |

(52) U.S. Cl.
CPC ............. *C30B 29/04* (2013.01); *C01B 32/25* (2017.08); *C30B 25/186* (2013.01); *C30B 25/20* (2013.01)

(58) Field of Classification Search
USPC ......... 118/715; 428/408, 698, 704; 427/577; 51/307, 309
See application file for complete search history.

(56) References Cited

U.S. PATENT DOCUMENTS

| | | | |
|---|---|---|---|
| 4,959,201 A | 9/1990 | Satoh et al. | |
| 2001/0176563 * | 7/2001 | Friel | .......................... 423/446 |
| 2004/0175499 A1* | 9/2004 | Twitchen | ................ C30B 29/04 427/249.8 |
| 2005/0217561 A1 | 10/2005 | Namba et al. | |
| 2010/0123098 A1* | 5/2010 | Hemley | ................ C23C 16/274 252/182.32 |
| 2015/0176155 A1 | 6/2015 | Ueda et al. | |

FOREIGN PATENT DOCUMENTS

| | | |
|---|---|---|
| EP | 2253746 A2 | 11/2010 |
| EP | 2516701 A1 | 10/2012 |
| EP | 2526220 A1 | 11/2012 |
| GB | 2433737 A | 7/2007 |
| GB | 2497660 A | 6/2013 |
| JP | S63-291896 A | 11/1988 |
| JP | H01-183409 A | 7/1989 |
| JP | 2004-214264 A | 7/2004 |
| JP | 2007-191356 * | 8/2007 |
| JP | 2008-110891 * | 5/2008 |
| JP | 2013-527117 A | 6/2013 |
| WO | 2011/076643 A1 | 6/2011 |
| WO | 2011/086164 A1 | 7/2011 |
| WO | 2011/151414 A2 | 12/2011 |
| WO | 2011/151415 A2 | 12/2011 |
| WO | 2011/151416 A2 | 12/2011 |
| WO | 2014/003110 A1 | 1/2014 |

OTHER PUBLICATIONS

Mokuno et al "Improving purity and size of single-crystal diamond plates produce by high-rate CVD growth and lift-off process using ion implantation" Diamond & Related Material 18 p. 1258-1261. (Year: 2009).*
Tallaire et al "Characterisation of high-quality thick single-crystal diamond grown by CVD with a low nitrogen addition" Diamond & Related Material 15 p. 1700-1707. (Year: 2006).*
International Search Report in counterpart International Application No. PCT/JP2015/070135, dated Sep. 8, 2015.

* cited by examiner

*Primary Examiner* — Archene A Turner
(74) *Attorney, Agent, or Firm* — Baker Botts LLP; Michael A. Sartori

(57) ABSTRACT

Single crystal diamond of which hardness and chipping resistance have been improved in a balanced manner, a method for manufacturing the single crystal diamond, and a tool containing the diamond are provided. Single crystal diamond contains nitrogen atoms, and a ratio of the number of isolated substitutional nitrogen atoms in the single crystal diamond to the total number of nitrogen atoms in the single crystal diamond is not lower than 0.02% and lower than 40%.

11 Claims, No Drawings

SINGLE CRYSTAL DIAMOND, METHOD FOR MANUFACTURING SINGLE CRYSTAL DIAMOND, AND TOOL CONTAINING SINGLE CRYSTAL DIAMOND

TECHNICAL FIELD

The present invention relates to single crystal diamond, a method for manufacturing the same, and a tool containing single crystal diamond.

BACKGROUND ART

Since single crystal diamond has excellent performance such as high hardness, high thermal conductivity, and high light transmittance, it has widely been used in various products such as a tool including a cutting tool, a grinding tool, and a wear resistant tool, optical components, semiconductors, and electronic components (hereinafter also referred to as "diamond products").

Single crystal diamond used for diamond products includes natural diamond and synthetic diamond. Natural diamond is considerably varied in quality and an amount of supply thereof is unstable, whereas synthetic diamond of constant quality can be supplied in a stable manner. Therefore, synthetic diamond is often used in the industrial field.

Impurity nitrogen in a crystal is one of primary factors determining performance of diamond. Impurity nitrogen affects many physical properties of diamond such as hardness, toughness, and semiconducting characteristics. For example, it has been known that with lowering in concentration of nitrogen in diamond, hardness of diamond is higher and wear resistance improves, whereas chipping resistance lowers. Therefore, a technique for controlling a concentration of nitrogen in diamond has been developed for obtaining synthetic diamond having desired physical properties.

A method for manufacturing synthetic diamond includes a high pressure high temperature method (HPHT) and chemical vapor deposition (CVD) such as hot filament chemical vapor deposition (CVD), microwave excited plasma CVD, and direct current plasma CVD.

With the high pressure high temperature method, a concentration of impurity nitrogen can be controlled approximately between 1 ppm and 200 ppm by adjusting gettering of nitrogen or conditions for growth during synthesis of diamond.

In CVD, a concentration of nitrogen in a diamond crystal can be controlled approximately between 10 ppb and 5 ppm by adjusting conditions for growth of single crystal diamond (an epitaxially grown layer) on a surface of a substrate.

SUMMARY OF INVENTION

Technical Problem

Diamond fabricated with the high pressure high temperature method has been disadvantageous in insufficient chipping resistance because fracture toughness lowers with increase in hardness by lowering in concentration of impurity nitrogen for the purpose of improvement in wear resistance. Diamond fabricated with CVD can be very low in concentration of impurity nitrogen, and hence it is high in hardness and excellent in wear resistance. It has been difficult, however, for such diamond to achieve sufficient fracture toughness and chipping resistance.

Thus, further improvement in performance of conventional single crystal diamond has been required for use as a material for a diamond tool.

The present invention was made in view of the problems above, and an object thereof is to provide single crystal diamond of which hardness and chipping resistance have been improved in a balanced manner, a method for manufacturing the single crystal diamond, and a tool containing the single crystal diamond.

Solution to Problem

The present inventors have studied about a method for appropriately introducing an impurity or a defect into a crystal for avoiding chipping of a material. Consequently, the present inventors have found that hardness and chipping resistance of single crystal diamond are improved in a balanced manner when a concentration of total nitrogen atoms representing an impurity in single crystal diamond and a concentration of isolated substitutional nitrogen atoms are within respective specific ranges, and completed the present invention.

The present invention is directed to single crystal diamond containing nitrogen atoms, in which a ratio of the number of isolated substitutional nitrogen atoms in the single crystal diamond to a total number of nitrogen atoms in the single crystal diamond is not lower than 0.02% and lower than 40%.

The present invention is directed to a method for manufacturing the single crystal diamond with chemical vapor deposition, the method including preparing a substrate having surface roughness (Ra) of a main surface not less than 0.006 μm and not more than 10 μm and growing single crystal diamond on the substrate, in a vapor phase in growing single crystal diamond, a ratio of a concentration of a methane gas to a concentration of a hydrogen gas being not lower than 7% and not higher than 30% and a ratio of a concentration of a nitrogen gas to a concentration of the methane gas being not lower than 0.02% and not higher than 10%.

The present invention is directed to a tool containing the single crystal diamond in a portion of contact with a work material, the tool being selected from the group consisting of a cutting bite, a milling cutter wiper, an end mill, a drill, a reamer, a cutter, a dresser, a wire guide, a wiredrawing die, a waterjet nozzle, a diamond knife, a glass cutter, and a scriber.

Advantageous Effects of Invention

According to the present invention, single crystal diamond of which hardness and chipping resistance have been improved in a balanced manner, a method for manufacturing the single crystal diamond, and a tool containing the single crystal diamond can be provided. When single crystal diamond according to the present invention is employed as a material for a tool, wear resistance and chipping resistance of the tool can be improved.

DESCRIPTION OF EMBODIMENTS

Description of Embodiments of Invention of Present Application

Embodiments of the present invention will initially be listed and described. An individual direction, a generic direction including crystallographically equivalent directions, an individual plane orientation, and a generic plane orientation including crystallographically equivalent plane orientations are herein shown in [ ], < >, ( ), and { }, respectively.

A first manner of the present invention is directed to single crystal diamond containing nitrogen atoms, in which a ratio of the number of isolated substitutional nitrogen atoms in the single crystal diamond to a total number of nitrogen atoms in the single crystal diamond is not lower than 0.02% and lower than 40% and preferably not lower than 0.1% and not higher than 20%.

Hardness and chipping resistance of the single crystal diamond according to the first manner of the present invention are improved in a balanced manner by setting a ratio of the number of isolated substitutional nitrogen atoms to the total number of nitrogen atoms in single crystal diamond to the range above.

In the single crystal diamond according to the first manner of the present invention, preferably, a concentration of total nitrogen atoms in the single crystal diamond is not lower than 0.5 ppm and not higher than 100 ppm and a concentration of the isolated substitutional nitrogen atoms in the single crystal diamond is not lower than 10 ppb and not higher than 8 ppm. Hardness and chipping resistance of the single crystal diamond are thus improved in a further balanced manner.

The single crystal diamond according to the first manner of the present invention preferably has a Knoop hardness not lower than 80 GPa and not higher than 125 GPa in a <100> direction at a {100} plane. Since this hardness is higher than hardness of conventional single crystal diamond fabricated with CVD, wear resistance of a tool is improved when the single crystal diamond is employed as a material for a tool.

The single crystal diamond according to the first manner of the present invention preferably has at most two chippings having a size not smaller than 1 μm and zero chipping having a size not smaller than 10 μm, per 1 mm of a ridge line in working of an edge at a right angle. When occurrence of chipping is within the range above, good balance between hardness and chipping resistance is achieved. When the single crystal diamond is employed as a material for a tool, wear resistance and chipping resistance of the tool are improved in a balanced manner. Here, an edge at a right angle is worked by polishing for 1 hour on a metal bonded polishing plate at a rate of 1.2 km/minute. After a (100) plane (of which off angle is within 15°) of single crystal diamond is polished, a surface thereof is substantially perpendicularly worked to thereby work an edge at a right angle.

High-purity single crystal diamond fabricated with the high pressure high temperature method has a Knoop hardness exceeding 100 GPa, whereas it has been insufficient in terms of occurrence of chipping in working of an edge at a right angle, because the single crystal diamond had, per 1 millimeter, three or more chippings having a size not smaller than 1 μm. Nitrogen-containing single crystal diamond fabricated with the high pressure high temperature method has been equivalent in chipping resistance to the present invention, however, it had a Knoop hardness lower than 95 GPa and hardness has been insufficient.

The single crystal diamond according to the first manner of the present invention is preferably obtained through annealing treatment in vacuum not lower than 1300° C. Through annealing treatment, internal atoms in single crystal diamond are reconstructed and propagation of a crack in single crystal diamond is suppressed while the single crystal diamond maintains high hardness.

A second manner of the present invention is directed to a method for manufacturing the single crystal diamond according to the first manner of the present invention with chemical vapor deposition, and the method includes preparing a substrate having surface roughness (Ra) of a main surface not less than 0.006 μm and not more than 10 μm and growing single crystal diamond on the substrate. In a vapor phase in growing single crystal diamond, a ratio of a concentration of a methane gas to a concentration of a hydrogen gas is not lower than 7% and not higher than 30% and a ratio of a concentration of a nitrogen gas to a concentration of the methane gas is not lower than 0.02% and not higher than 10%. Surface roughness (Ra) of the main surface refers to surface roughness measured in a 100-μm square area, and the center of measurement is located at a central portion of the surface of the substrate (within a 500-μm radius from the center of gravity of the plane). Surface roughness is further preferably homogenous across the surface of the substrate. Being homogenous here refers to such a state that surface roughnesses measured in a 100-μm square area at the central portion of the surface of the substrate (within a 500-μm radius from the center of gravity of the plane) and at at least one, preferably three or more, and further preferably five or more location(s) in peripheral portions (positions where the center of measurement is located within 1 mm from an end of the surface of the substrate) are within a range from ⅓ time to 3 times as large as a median value of measurement values. The substrate is preferably in a shape of a square or a rectangle of which main surface has a side not smaller than 3 mm.

According to the method for manufacturing single crystal diamond according to the second manner of the present invention, the single crystal diamond according to the first manner of the present invention can be obtained.

In the method for manufacturing single crystal diamond according to the second manner of the present invention, preferably, the substrate has a main surface having an off angle with respect to a {001} plane not smaller than 0° and not greater than 15°.

Single crystal diamond can thus efficiently be formed to a large thickness on the substrate. Homogeneity of single crystal diamond is further improved.

In the method for manufacturing single crystal diamond according to the second manner of the present invention, preferably, a main surface of a seed substrate includes grooves in parallel to at least any of a ±[100] direction and a ±[010] direction with respect to a (001) plane.

With the grooves in the main surface of the substrate, the grooves are soon buried in a process for growth thereon, and the surface after growth in which grooves have been buried can lead to a greater amount of total nitrogen atoms taken into single crystal diamond. A ratio of the number of isolated substitutional nitrogen atoms to the total number of nitrogen atoms can be lowered.

Details of Embodiment of Invention of Present Application

Single crystal diamond and a method for manufacturing the same according to the present invention will be described below in further detail.

<Single Crystal Diamond>

In one embodiment of the present invention, single crystal diamond contains nitrogen atoms, in which a ratio of the number of isolated substitutional nitrogen atoms in the single crystal diamond to a total number of nitrogen atoms in the single crystal diamond is not lower than 0.02% and lower than 40% and preferably not lower than 0.1% and not higher than 20%.

Preferably, a concentration of total nitrogen atoms in the single crystal diamond is not lower than 0.5 ppm and not higher than 100 ppm and a concentration of isolated substitutional nitrogen atoms in the single crystal diamond is not lower than 10 ppb and not higher than 8 ppm. More preferably, a concentration of total nitrogen atoms is not lower than 5 ppm and not higher than 70 ppm and a concentration of the isolated substitutional nitrogen atoms is not lower than 50 ppb and not higher than 4 ppm. Further preferably, a concentration of total nitrogen atoms is not lower than 10 ppm and not higher than 50 ppm and a concentration of the isolated substitutional nitrogen atoms is not lower than 200 ppb and not higher than 2 ppm.

In the present embodiment, single crystal diamond contains nitrogen atoms as an impurity. When nitrogen atoms are present in single crystal diamond, a defect or lattice distortion is produced in a crystal of single crystal diamond. In general, when a crack is produced, the crack is likely to propagate in single crystal diamond, and hence single crystal diamond is insufficient in chipping resistance. When a defect or lattice distortion is present in a crystal of diamond, the defect or lattice distortion suppresses propagation of a crack and hence chipping resistance of the crystal of diamond improves. Therefore, single crystal diamond in the present embodiment can achieve suppression of propagation of a crack and can have excellent chipping resistance. Single crystal diamond in the present embodiment can achieve improvement in chipping resistance of a tool when it is employed as a material for the tool.

In one embodiment of the present invention, single crystal diamond contains nitrogen atoms, and a ratio of the number of isolated substitutional nitrogen atoms in single crystal diamond to the total number of nitrogen atoms in the single crystal diamond is not lower than 0.02% and lower than 40%. When the ratio of the number of isolated substitutional nitrogen atoms to the total number of nitrogen atoms is in a range not lower than 0.02% and lower than 40%, propagation of a crack can be suppressed while single crystal diamond maintains high hardness, owing to reconstruction of internal atoms resulting from annealing treatment of single crystal diamond. Annealing treatment is performed in vacuum not lower than 1300° C.

The present inventors have found that a ratio of the number of isolated substitutional nitrogen atoms to the total number of nitrogen atoms in single crystal diamond significantly affects hardness and chipping resistance. The present inventors have further found that characteristics of single crystal diamond are improved by subjecting single crystal diamond according to the present invention to annealing treatment in vacuum. In order to obtain an effect of improvement in characteristics through annealing treatment, it is important that a ratio of the number of isolated substitutional nitrogen atoms to the total number of nitrogen atoms in single crystal diamond is within a desired range, specifically, not lower than 0.02% and lower than 40%. When the ratio is out of the range above, characteristics become poor; for example, chipping increases in spite of annealing treatment, although hardness of single crystal diamond is improved.

A ratio of the number of isolated substitutional nitrogen atoms in single crystal diamond to the total number of nitrogen atoms in single crystal diamond is preferably not lower than 0.1% and not higher than 20%. When the ratio of the number of isolated substitutional nitrogen atoms to the total number of nitrogen atoms is in a range not lower than 0.1% and not higher than 20%, propagation of a crack can be suppressed while single crystal diamond maintains high hardness without annealing treatment thereof. A ratio of the number of isolated substitutional nitrogen atoms to the number of total nitrogen atoms is further preferably not lower than 0.5% and not higher than 15% and still further preferably not lower than 1% and not higher than 10%. When a ratio of the number of isolated substitutional nitrogen atoms to the total number of nitrogen atoms in single crystal diamond is out of the range not lower than 0.02% and lower than 40%, single crystal diamond high in hardness and excellent in resistance to propagation of a crack cannot be obtained even though single crystal diamond is subjected to annealing treatment.

A concentration of total nitrogen atoms in single crystal diamond is preferably not lower than 0.5 ppm and not higher than 100 ppm.

When a concentration of total nitrogen atoms in single crystal diamond is lower than 0.5 ppm, an amount of defect or distortion in a crystal of diamond is small and propagation of a crack cannot sufficiently be suppressed. When a concentration of total nitrogen atoms in single crystal diamond exceeds 100 ppm, an amount of defect or distortion in a crystal of diamond is excessively large and hardness lowers. A concentration of total nitrogen atoms in single crystal diamond is more preferably not lower than 5 ppm and not higher than 70 ppm and further preferably not lower than 10 ppm and not higher than 50 ppm. A concentration of total nitrogen atoms in single crystal diamond is measured with secondary ion mass spectrometry (SIMS).

Nitrogen in single crystal diamond can be categorized into substitutional nitrogen atoms and non-substitutional nitrogen atoms, depending on a form of presence thereof.

A substitutional nitrogen atom refers to a nitrogen atom which is present as being substituted for a position of a carbon atom in a crystal of diamond. Substitutional nitrogen atoms can further be categorized into isolated substitutional nitrogen atoms, dimer substitutional nitrogen atoms, and tetramer substitutional nitrogen atoms, depending on arrangement of nitrogen in a crystal of diamond.

Isolated substitutional nitrogen atoms are such nitrogen atoms as being substituted for positions of carbon atoms in a crystal of diamond in an isolated manner and present in type-Ib diamond. Since unpaired electrons derived from nitrogen atoms are present in single crystal diamond containing isolated substitutional nitrogen atoms, a concentration of isolated substitutional nitrogen atoms can be measured, for example, with electron spin resonance (ESR) analysis. Though a signal of a defect having unpaired electrons other than isolated substitutional nitrogen is also detected in ESR, it is separated based on a g value or a relaxing time period of the signal.

Dimer substitutional nitrogen atoms are also referred to as a nitrogen 2-atom pair in which two nitrogen atoms are bound covalently to each other and are substituted for carbon atoms, and they are present in type-IaA diamond. Tetramer substitutional nitrogen atoms are also referred to as a nitrogen 4-atom aggregate in which four nitrogen atoms are present adjacently to one vacancy and substituted for carbon atoms, and they are present in type-IaB diamond. Only an extremely small amount of unpaired electrons is present in single crystal diamond containing dimer substitutional nitrogen atoms and tetramer substitutional nitrogen atoms. Therefore, dimer substitutional nitrogen atoms and tetramer substitutional nitrogen atoms exhibit only very weak absorption in ESR analysis.

Non-substitutional nitrogen atoms are nitrogen atoms not falling under substitutional nitrogen atoms among nitrogen atoms present in single crystal diamond. A non-substitutional nitrogen atom is bound to an adjacent carbon atom or nitrogen atom with weak binding force resulting from van der Walls force while bond between carbon atoms is inhibited in single crystal diamond. When external force such as a crack is applied to single crystal diamond, arrangement of non-substitutional nitrogen atoms is readily displaced and propagation of the crack is suppressed. When non-substitutional nitrogen atoms are present in single crystal diamond, vacancies are produced in single crystal diamond. When vacancies are present in single crystal diamond, propagation of a crack is suppressed in a portion of vacancy. When non-substitutional nitrogen atoms are present in single crystal diamond, propagation of a crack can be suppressed.

In one embodiment of the present invention, a concentration of isolated substitutional nitrogen atoms in single crystal diamond is preferably not lower than 10 ppb and not higher than 8 ppm. Since isolated substitutional nitrogen atoms do not significantly affect crystal structure itself of single crystal diamond, they do not contribute to suppression of propagation of a crack. Non-substitutional nitrogen atoms can suppress propagation of a crack in single crystal diamond. Therefore, by lowering a concentration of isolated substitutional nitrogen atoms which do not contribute to suppression of propagation of a crack among nitrogen atoms present in single crystal diamond, an effect of suppression of propagation of a crack originating from non-substitutional nitrogen atoms can be improved. When a concentration of isolated substitutional nitrogen atoms in single crystal diamond is lower than 10 ppb, it also becomes difficult to introduce non-substitutional nitrogen atoms. Therefore, introduction of isolated substitutional nitrogen atoms to some extent is necessary. When a concentration of isolated substitutional nitrogen atoms in single crystal diamond exceeds 8 ppm, binding force at each portion of a crystal becomes weaker, which aggravates a crack to the contrary. From a point of view of balance between the effect of suppression of a crack and hardness, a concentration of isolated substitutional nitrogen atoms in single crystal diamond is preferably not lower than 30 ppb and not higher than 5 ppm, preferably not lower than 50 ppb and not higher than 4 ppm, preferably not lower than 100 ppb and not higher than 800 ppb, and further preferably not lower than 200 ppb and not higher than 2 ppm. A concentration of isolated substitutional nitrogen atoms in single crystal diamond is measured with ESR analysis.

In one embodiment of the present invention, single crystal diamond has a Knoop hardness in a <100> direction at a {100} plane, preferably not lower than 80 GPa and not higher than 125 GPa, further preferably not lower than 95 GPa and not higher than 120 GPa, and further preferably not lower than 100 GPa and not higher than 120 GPa. This hardness can be found based on a size of an indentation when a Knoop indenter is pressed against a surface of diamond at 10 to 20 N. Single crystal diamond of which hardness is within the range above is higher in hardness and wear resistance than a single crystal of natural diamond or high pressure high temperature diamond which contains nitrogen and has conventionally been employed.

Chipping resistance of single crystal diamond can be evaluated based on chipping in working of an edge at a right angle. An edge at a right angle is worked by polishing for 1 hour on a common metal bonded polishing plate at a rate of 1.2 km/minute. This is a condition for working for planarizing common diamond. After a (100) plane of a single crystal (of which off angle is within 15°) is polished, the surface is substantially perpendicularly worked to thereby work an edge at a right angle. Influence by time is not so great, because a new surface is worked to be planarized even though a long time is spent. A time period during which an area extending inward by 1 mm from a perpendicular ridge line becomes planarized is sufficient. Chipping resistance is evaluated based on a size and the number of chippings which are present per unit length (1 mm) of the ridge line. A size of chipping means a length of a portion distant from linearity of the ridge line by 0.3 µm or more (a chipped portion) in observation with observation means (for example, a scanning electron microscope (SEM)) having a resolution smaller (higher) than 1 µm.

Single crystal diamond in the present embodiment preferably has at most two chippings having a size not smaller than 1 µm and zero chipping having a size not smaller than 10 µm, per 1 mm of a ridge line in working of an edge at a right angle. Single crystal diamond has further preferably at most one chipping and most preferably zero chipping having a size not smaller than 1 µm, per 1 mm of the ridge line.

<Method for Manufacturing Single Crystal Diamond>

Single crystal diamond in one embodiment of the present invention can be fabricated, for example, with a method below.

[Preparation of Substrate]

Initially, single crystal diamond fabricated with the high pressure high temperature method or chemical vapor deposition is prepared as a substrate. Single crystal diamond fabricated with the high pressure high temperature method is preferred because crystal distortion is relatively less. The substrate has a thickness preferably not smaller than 100 µm from a point of view of handleability and preferably not greater than 3 mm from a point of view of availability. A thickness of the substrate is measured in the vicinity of the center of a main surface of the substrate.

Then, surface roughness (Ra) of the main surface of the substrate is adjusted to be not less than 0.006 µm and not more than 10 µm. Surface roughness (Ra) means arithmetic mean roughness, and means a value which is expressed in micrometer (µm) and calculated in an expression (1) below when a reference length alone is extracted from a roughness curve in a direction of an average line, an X axis is defined in the direction of the average line of this extracted portion and a Y axis is defined in a direction of a vertical magnification, and the roughness curve is expressed with y=f(x).

$$Ra = \frac{1}{\ell}\int_0^\ell |f(x)|\,dx \qquad \text{Expression (1)}$$

In chemical vapor deposition, in order to enhance homogeneity of single crystal diamond to epitaxially be grown, a surface of the substrate is generally smoothened and cleaned by mechanical polishing. In one embodiment of the present invention, a single crystal diamond substrate of which surface is roughened and of which surface roughness (Ra) is not less than 0.006 µm and not more than 10 µm is employed as the substrate. When the surface of the substrate is roughened to form irregularities, the irregularities serve as a starting point of introduction of impurity nitrogen into single crystal diamond or formation of vacancies in single crystal diamond during epitaxial growth of single crystal diamond on the substrate. Therefore, obtained single crystal diamond contains nitrogen atoms and vacancies. Since nitrogen atoms or vacancies in single crystal diamond can suppress propagation of a crack, single crystal diamond can have excellent chipping resistance.

General methods for introducing impurity nitrogen or forming vacancies in single crystal diamond include electron beam irradiation, neutron beam irradiation, and ion implantation. With these methods, however, excessive carbon flicked by irradiation becomes a graphite component, and hence single crystal diamond becomes lower in hardness and wear resistance. When single crystal diamond is epitaxially grown with the use of a substrate of which surface is roughened, a graphite component is hardly formed in single crystal diamond and hence chipping resistance can be improved without lowering in hardness of single crystal diamond. Whether or not graphite is present in single crystal diamond can be checked, for example, with X-ray diffraction, Raman spectroscopy, electron energy-loss spectroscopy (EELS), X-ray photoelectron spectroscopy (XPS), or cathode luminescence (CL).

When the substrate has surface roughness (Ra) less than 0.006 μm, introduction of impurity nitrogen or formation of vacancies is insufficient during epitaxial growth and chipping resistance of obtained single crystal diamond cannot be improved even though single crystal diamond is subjected to annealing treatment. When surface roughness (Ra) of the substrate exceeds 10 μm, single crystal diamond cannot epitaxially be grown. Surface roughness (Ra) of the substrate is preferably not less than 0.03 μm and not more than 10 μm and further preferably not less than 0.05 μm and not more than 1 μm. Surface roughness (Ra) of the substrate is preferably not less than 0.05 μm and not more than 10 μm, preferably not less than 0.1 μm and not more than 5 μm, and preferably not less than 0.5 μm and not more than 1 μm. Surface roughness (Ra) of the substrate is measured with a microscope based on principles of scanning white light interferometry.

A method for roughening the surface of the substrate is not particularly limited. For example, the method includes a method of providing grooves owing to polishing flaws in the main surface of the substrate by polishing in a <100> direction with a rate of polishing being adjusted to a coefficient higher by 10 to 30% than a steady kinetic friction coefficient, with the use of a metal-bonded grindstone and a method of polishing common diamond. Alternatively, it is effective to provide grooves of which aspect ratio (a ratio between a depth and a width) is 2 or higher through etching using laser, photolithography, or a metal mask after common planarization polishing and to thereafter synthesize diamond in accordance with a degree of burying of grooves (a width of grooves and a growth rate) for 10 minutes to 60 minutes and preferably for 0.5 to 5 hours in the absence of nitrogen. As single crystal diamond has such a surface structure as obtained in a process for burying grooves in a seed substrate, nitrogen is specifically contained and chipping resistance of single crystal diamond is improved. With laser, other than working for providing grooves, working for directly roughening a surface such as working substantially in parallel to the surface like slicing the surface can also be performed. Surface roughness Ra obtained with laser, however, is not less than 5 μm. Surface roughness in the present embodiment is not simply for the purpose of providing grooves, but it is important to control surface roughness by making use of production of a height difference in a portion where a gap is closed by burying grooves in subsequent non-doped epitaxial growth. With this method, when grooves are equal to one another in width, surface roughness is greater depending on an off angle of the substrate. An off angle from 0 to 15° is preferred because surface roughness (Ra) of the main surface is readily controlled to be not less than 0.006 μm and not more than 10 μm. Use of photolithography is convenient because surface roughness can uniformly be provided in a plane. With mechanical polishing, since it is important to uniformly provide surface roughness in a plane, load or a direction of polishing should be controlled.

Grooves in the main surface of the substrate are preferably in parallel to at least any of a ±[100] direction and a ±[010] direction with respect to a (001) plane. When a direction of grooves is set to at least any of a ±[110] direction and [011] with respect to the (001) plane, the substrate tends to break when it is freestanding, which is not preferred. From a point of view of introduction of nitrogen atoms and formation of vacancies in single crystal diamond, a density of grooves is preferably not less than 3/mm and not more than 1000/mm. A density of grooves is further preferably not less than 30/mm and not more than 100/mm.

The main surface of the substrate has an off angle with respect to the {001} plane not smaller than 0° and not greater than 15°. When the off angle is not smaller than 0° and not greater than 15°, of growth like an island and step flow growth representing crystal growth modes in an attempt to obtain single crystal diamond through epitaxial growth on the main surface of the substrate, step flow growth which becomes a factor for low toughness can be suppressed. From a point of view of improvement in effect of suppression of step flow growth and introduction of an impurity during growth of a film, the off angle is preferably not greater than 7° and further preferably not greater than 3°. A large off angle leads to greater maximal surface roughness (Rmax) owing also to mechanical polishing, provision of grooves with the use of laser or photolithography, or subsequent alteration of a surface shape after non-doped epitaxial growth. Namely, surface roughness (Ra) at a value ⅓ to 1/30 as large as the maximal surface roughness is also greater. From a point of view of further roughness of the surface, the off angle is preferably not smaller than 0.5° and preferably not smaller than 5°. In comprehensive consideration of the above, the off angle is preferably not smaller than 0.5° and not greater than 8° and further preferably not smaller than 2° and not greater than 7°.

[Growth of Single Crystal Diamond]

Then, single crystal diamond is grown on the substrate. A method for growth is not particularly limited, and hot filament CVD, microwave plasma CVD, direct current plasma CVD, and a direct current arc discharge plasma method can be employed. Among these, microwave plasma CVD is preferred because introduction of an unintended impurity is less.

In epitaxial growth of diamond with microwave plasma CVD, single crystal diamond can epitaxially be grown by introducing a hydrogen gas, a methane gas, and a nitrogen gas as source material gases in a synthesis furnace, keeping a pressure not lower than 4 kPa and not higher than 53.2 kPa in the furnace, generating plasma by applying microwaves at a frequency of 2.45 GHz (±50 MHz) or 915 MHz (±50 MHz) at power of 100 W to 60 kW, and thereby depositing active species on the substrate.

A pressure in the furnace is preferably not lower than 4 kPa and not higher than 53.2 kPa, further preferably not lower than 8 kPa and not higher than 40 kPa, and further preferably not lower than 10 kPa and not higher than 20 kPa. When the pressure in the furnace is lower than 4 kPa, it takes time for growth or polycrystals tend to grow. When the pressure in the furnace exceeds 53.2 kPa, discharging becomes unstable or discharging is concentrated to one location during growth, which makes growth for a long period of time difficult.

A temperature of the substrate is preferably not lower than 800° C. and not higher than 1300° C. and further preferably not lower than 900° C. and not higher than 1100° C. When a temperature of the substrate is lower than 800° C., it takes time for growth. When a temperature of the substrate exceeds 1300° C., graphite tends to grow.

In a vapor phase in which single crystal diamond is synthesized, a ratio of a concentration of a methane gas to a concentration of a hydrogen gas is not lower than 7% and not higher than 30% and a ratio of a concentration of a nitrogen gas to the concentration of the methane gas is not lower than 0.02% and not higher than 10%. A ratio of a concentration of a gas is calculated based on mole % of each gas in a reaction furnace and it is equal to a ratio (proportion) of a flow rate of a gas in a standard state. Thus, single crystal diamond in which a ratio of the number of isolated substitutional nitrogen atoms in single crystal diamond to the total number of nitrogen atoms in single crystal diamond is not lower than 0.02% and lower than 40% can be obtained. Furthermore, single crystal diamond in which a concentration of total nitrogen atoms in single crystal diamond is not lower than 0.5 ppm and not higher than 100 ppm and a concentration of isolated substitutional nitrogen atoms is not lower than 10 ppb and not higher than 8 ppm can be obtained. A ratio of a concentration of the methane gas to a concentration of the hydrogen gas is further preferably not lower than 10% and not higher than 20% and further preferably not lower than 10% and not higher than 15%. A ratio of a concentration of the nitrogen gas to a concentration of the methane gas is further preferably not lower than 0.1% and not higher than 5%, preferably not lower than 0.5% and not higher than 10%, and preferably not lower than 1% and not higher than 10%. A concentration Cn (%) of the nitrogen gas and a concentration Cc (%) of the methane gas preferably satisfy relation in an expression (2) below:

$$A+B\times\log 10Cn=Cc \qquad \text{Expression (2)}$$

(where 10≤A≤20 and 2≤B≤7.)

When concentration Cn (%) of the nitrogen gas and concentration Cc (%) of the methane gas satisfy relation in the expression (2) above, chipping resistance can be improved while hardness of single crystal diamond is maintained.

[Separation of Single Crystal Diamond]

Then, single crystal diamond is obtained by separating epitaxially grown single crystal diamond from the substrate. A separation method includes, for example, a method of cutting with laser irradiation and a method of forming a separation boundary in advance by ion implantation, synthesizing diamond on an ion implanted surface, and thereafter separating diamond at a separation boundary surface resulting from ion implantation.

Obtained single crystal diamond achieves improved chipping resistance while it maintains hardness as high as hardness of conventional single crystal diamond fabricated with chemical vapor deposition.

<Tool Containing Single Crystal Diamond>

In one embodiment of the present invention, single crystal diamond can suitably be employed for diamond products. Specifically, single crystal diamond can be employed for such a cutting tool as a cutting bite (a diamond bite), a drill, an end mill, a throw-away chip for a drill, a throw-away chip for an end mill, a throw-away chip for milling (a milling cutter wiper), a throw-away chip for cutting, a metal saw, a gear cutting tool, a reamer, a tap, a cutter, a waterjet nozzle, a diamond knife, and a glass cutter. Single crystal diamond can also be employed for a grinding tool, a wear resistant tool, and a part, without being limited to a cutting tool. A grinding tool includes a dresser. A wear resistant tool and a part can include a wiredrawing die, a scriber, a water or powder injection nozzle, a wire guide, a heat radiation part (a heat sink), and an X-ray window material. Though irrelevant to the latter tools, chipping resistance is important in an end surface having accuracy for laser mount (requiring mirror finishing) or a window material to which stress is applied or a part in which a fracture originating from chipping should be prevented as much as possible.

Example 1

[Samples 1 to 5]

(Preparation of Substrate)

A substrate composed of type-Ib single crystal diamond fabricated with the high pressure high temperature method (having a thickness of 500 μm and a size of 5-mm square) was prepared as the substrate. A plane orientation of a main surface of this substrate was the (001) plane.

The main surface of the prepared substrate was mechanically polished to be angled off by 2° from the (001) plane in a [010] direction. Thereafter, surfaces of the substrates employed for sample 1 to sample 4 were roughened by forming polishing flaws with a metal-bonded diamond grindstone with a rate being controlled such that the surfaces of the substrates had surface roughnesses shown in Table 1. The substrate employed for sample 5 was subjected to treatment similar to treatment of the substrate with conventional CVD. Specifically, the substrate was mechanically polished to such an extent that polishing flaws could not be observed with a differential interference microscope, and thereafter etched by 2 μm in a direction of thickness through reactive ion etching (ME) in which an oxygen gas and a $CF_4$ gas were used.

(Growth of Single Crystal Diamond)

The fabricated substrate was arranged in a known microwave plasma CVD apparatus and single crystal diamond was epitaxially grown. Table 1 shows conditions for growth. A frequency of microwaves was set to 2.45 GHz, power of microwaves was set to 5 kW, and a time period for growth was set to 60 hours.

As a result of growth, vapor-phase synthesis single crystal diamond having a thickness of 1.2 mm was obtained.

(Separation of Single Crystal Diamond)

The substrate and vapor-phase synthesis single crystal diamond were separated from each other by cutting with laser and thereafter common polishing was performed for planarization.

(Measurement)

A concentration of total nitrogen atoms, a concentration of isolated substitutional nitrogen atoms, a Knoop hardness, and chipping resistance of obtained single crystal diamond and high pressure high temperature synthetic type-Ib diamond prepared as a comparative example were determined.

A concentration of total nitrogen atoms was measured with SIMS.

A concentration of isolated substitutional nitrogen atoms was measured with ESR analysis.

A hardness was found by forming indentations at five points at a load of 5 N in the <100> direction of the (001) plane of single crystal diamond and comparing an average value of three points except for the maximum and the minimum of the obtained indentation widths with a result of a standard sample (high pressure high temperature type-IIa single crystal diamond) of which hardness had been known in advance.

Chipping resistance was evaluated based on chipping during working of an edge at a right angle. Specifically, an edge at a right angle was worked by polishing the (100) plane (of which off angle was within 3°) of single crystal diamond at a rate of 1.2 km/minute on a metal-bonded polishing plate and thereafter working the single crystal diamond substantially perpendicularly thereto (a range from 87 to 93°). Single crystal diamond was polished until an area extending inward by 1 mm from the perpendicular ridge line was planarized. A length and the number of chippings per unit length (1 mm) of the ridge line were determined.

Table 1 shows results.

hardness of 120 GPa. Regarding chipping resistance, the single crystal diamond had 8 chippings having a length not smaller than 1 µm and 0 chipping having a length not smaller than 10 µm.

In high pressure high temperature type-Ib diamond, a concentration of total nitrogen atoms was 150 ppm and a concentration of isolated substitutional nitrogen atoms was 150 ppb, and the diamond had a hardness of 85 GPa. Regarding chipping resistance, the diamond had 1 chipping having a length not smaller than 1 µm and 0 chipping having a length not smaller than 10 µm.

It is considered based on results above that single crystal diamonds as sample 1 to sample 3 achieved improvement in hardness and chipping resistance in a balanced manner and

TABLE 1

| | Substrate | Conditions for Growth | | | | | Single Crystal Diamond | | | | | |
|---|---|---|---|---|---|---|---|---|---|---|---|---|
| Sample | Surface Roughness (Ra) (µm) | Hydrogen Gas Flow Rate (sccm) | Methane Gas Flow Rate (sccm) | Nitrogen Gas Flow Rate (sccm) | Pressure in Furnace (kPa) | Temperature of Substrate (° C.) | Concentration of Total Nitrogen Atoms (ppm) | Concentration of Isolated Substitutional Nitrogen Atoms (ppb) | Isolated Substitutional Nitrogen/ Total Nitrogen (%) | Hardness (GPa) | Chipping Resistance (The Number of Chippings per 1 mm of Ridge Line) | |
| | | | | | | | | | | | Size of Chipping Not Smaller Than 1 µm | Size of Chipping Not Smaller Than 10 µm |
| 1 | 0.05 | 1000 | 150 | 0.5 | 15 | 1150 | 1 | 100 | 10 | 120 | 2 | 0 |
| 2 | 0.2 | 1000 | 150 | 1 | 15 | 1150 | 10 | 250 | 2.5 | 105 | 1 | 0 |
| 3 | 0.5 | 1000 | 150 | 1 | 15 | 1150 | 50 | 400 | 0.8 | 95 | 0 | 0 |
| 4 | 0.2 | 1000 | 120 | 0.05 | 15 | 1150 | 0.4 | 100 | 25 | 110 | 5 | 0 |
| 5 | 0.005 | 1000 | 80 | 0.5 | 15 | 1150 | 0.2 | 80 | 40 | 120 | 8 | 0 |
| High Pressure High Temperature Synthetic Type-Ib Diamond | | | — | | | | 150 | 150 | 100 | 85 | 1 | 0 |

(Results of Evaluation)

Samples 1 to 3 were single crystal diamonds fabricated with the substrates of which surface roughness (Ra) was not less than 0.05 µm and not more than 0.5 µm, in which a concentration of total nitrogen atoms was not lower than 1 ppm and not higher than 50 ppm and a concentration of isolated substitutional nitrogen atoms was not lower than 100 ppb and not higher than 400 ppb. These single crystal diamonds had a hardness not lower than 95 Ga and not higher than 120 GPa. Regarding chipping resistance, single crystal diamonds had at least 0 and at most 2 chippings having a length not smaller than 1 µm and 0 chipping having a length not smaller than 10 µm.

Sample 4 was single crystal diamond fabricated with the substrate of which surface roughness (Ra) was 0.2 µm, in which a concentration of total nitrogen atoms was 0.4 ppm and a concentration of isolated substitutional nitrogen atoms was 100 ppb. Single crystal diamond as sample 4 had a hardness of 110 GPa. Regarding chipping resistance, the single crystal diamond had 5 chippings having a length not smaller than 1 µm and 0 chipping having a length not smaller than 10 µm.

Sample 5 was single crystal diamond fabricated with the substrate of which surface roughness (Ra) was 0.005 µm, in which a concentration of total nitrogen atoms was 0.2 ppm and a concentration of isolated substitutional nitrogen atoms was 80 ppb. Single crystal diamond as sample 5 had a would exhibit excellent wear resistance and chipping resistance when they were contained in a tool.

Example 2

[Samples 1-1 to 1-5]
(Preparation of Samples)

Samples 1-1 to 1-5 were fabricated by subjecting samples 1 to 5 fabricated in Example 1 to annealing treatment for 1 hour in vacuum at 1500° C. Chipping resistance of the obtained samples was evaluated. Table 2 shows results. In each sample, a ratio of the number of isolated substitutional nitrogen atoms in single crystal diamond to the total number of nitrogen atoms in single crystal diamond did not vary in spite of annealing treatment.

TABLE 2

| | After Annealing Chipping Resistance (The Number of Chippings per 1 mm of Ridge Line) | |
|---|---|---|
| Sample | Size of Chipping Not Smaller Than 1 µm | Size of Chipping Not Smaller Than 10 µm |
| 1-1 | 0 | 0 |
| 1-2 | 0 | 0 |
| 1-3 | 0 | 0 |

TABLE 2-continued

| | After Annealing Chipping Resistance (The Number of Chippings per 1 mm of Ridge Line) | |
|---|---|---|
| Sample | Size of Chipping Not Smaller Than 1 μm | Size of Chipping Not Smaller Than 10 μm |
| 1-4 | 1 | 0 |
| 1-5 | 4 | 0 |

As shown in the results of evaluation in Example 1, in samples 1 and 2, the number of chippings having a size not smaller than 1 μm was 2 and 1, respectively. In samples 1-1 and 1-2 obtained by subjecting these samples to annealing treatment, the number of chippings having a size not smaller than 1 μm was zero and performance as a tool was improved.

In sample 4, the number of chippings having a size not smaller than 1 μm was 5. In sample 1-4 obtained by subjecting sample 4 to annealing treatment, the number of chippings having a size not smaller than 1 μm was 1, and it could be confirmed that a good product was obtained.

In sample 5, the number of chippings having a size not smaller than 1 μm was 8. In sample 1-5 obtained by subjecting sample 5 to annealing treatment, the number of chippings having a size not smaller than 1 μm was 4, and significant improvement to a good product was not achieved.

It was confirmed based on results above that chipping resistance of single crystal diamond was significantly improved through annealing treatment when a ratio of the number of isolated substitutional nitrogen atoms to the total number of nitrogen atoms in single crystal diamond was not higher than 25%.

When samples 1 to 5 were subjected to annealing treatment in vacuum at 1300° C. for 50 hours or in vacuum at 1400° C. for 8 hours, obtained samples also achieved results similar to the above.

Example 3

[Samples 11 to 22]

Single crystal diamonds as samples 11 to 22 were synthesized under conditions shown in Table 4, with an off angle of the substrate, a treatment method, a width of grooves, and surface roughness being varied.

(Preparation of Substrate)

A substrate composed of type-Ib single crystal diamond fabricated with the high pressure high temperature method (having a thickness of 500 μm and a size of 5-mm square) was prepared as the substrate. A plane orientation of a main surface of this substrate was the (001) plane.

All samples were mechanically polished such that the main surfaces of the prepared substrates were angled off from the (001) plane in the [010] direction by values as shown in Table 3. Thereafter, the surfaces of substrates for samples 11, 12, 16, 18, and 21 were roughened through mechanical polishing by forming polishing flaws with a metal-bonded diamond grindstone with a rate being controlled such that the surfaces of the substrates had surface roughnesses shown in Table 3 (mechanical polishing). The surfaces of the substrates for samples 13, 14, 15, 17, and 19 were roughened by providing grooves with photolithography such that the surfaces of the substrates had surface roughnesses shown in Table 3 and epitaxially growing diamond so as to bury grooves (synthesis by burying grooves). Conditions for epitaxial growth for burying grooves included a flow rate of a methane gas to a hydrogen gas being 7% and absence of addition of a nitrogen gas. A pressure was set to 13 kPa and a temperature of the substrate was set to 1180° C. The surfaces of the substrates for samples 20 and 22 were roughened by irradiation of the surfaces with laser substantially in parallel thereto (like slicing the surface) (laser processing). Finally, the substrate for sample 21 was subjected to treatment similar to treatment for sample 5 in Example 1.

TABLE 3

| Sample | Off Angle (°) | Treatment of Substrate | Width of Grooves (μm) | Substrate Surface Roughness (Ra) |
|---|---|---|---|---|
| 11 | 0.1 | Mechanical Polishing | — | 0.05 |
| 12 | 2.8 | Mechanical Polishing | — | 0.2 |
| 13 | 6.7 | Synthesis by Burying Grooves | 8 | 0.08 |
| 14 | 10 | Synthesis by Burying Grooves | 25 | 0.5 |
| 15 | 14 | Synthesis by Burying Grooves | 3 | 0.06 |
| 16 | 0.1 | Mechanical Polishing | — | 0.5 |
| 17 | 2.8 | Synthesis by Burying Grooves | 10 | 0.03 |
| 18 | 6.7 | Mechanical Polishing | — | 0.3 |
| 19 | 0.8 | Synthesis by Burying Grooves | 5 | 0.006 |
| 20 | 10 | Laser Processing | — | 9.5 |
| 21 | 14 | Mechanical Polishing | — | 0.003 |
| 22 | 16 | Laser Processing | — | 11 |

(Growth of Single Crystal Diamond)

The fabricated substrate was arranged in a known microwave plasma CVD apparatus and single crystal diamond was epitaxially grown. Table 4 shows conditions for growth. A frequency of microwaves was set to 2.45 GHz, power of microwaves was set to 5 kW, and a time period for growth was adjusted such that a thickness after growth was around 1 mm.

(Separation of Single Crystal Diamond)

The substrate and vapor-phase synthesis single crystal diamond were separated from each other by cutting with laser and thereafter common polishing was performed for planarization.

(Annealing)

Samples 11 to 22 were fabricated by performing annealing treatment for 1 hour in vacuum at 1500° C. as in Example 2. Chipping resistance of the obtained samples was evaluated. Table 4 shows results. In each sample, a ratio of the number of isolated substitutional nitrogen atoms in single crystal diamond to the total number of nitrogen atoms in single crystal diamond did not vary in spite of annealing treatment.

(Measurement)

A concentration of total nitrogen atoms, a concentration of isolated substitutional nitrogen atoms, a Knoop hardness, and chipping resistance were determined with a method the same as in Example 1. Table 4 shows results.

TABLE 4

| Sample | Conditions for Growth | | | | | | | | Single Crystal Diamond | |
|---|---|---|---|---|---|---|---|---|---|---|
| | Substrate Surface Roughness (Ra) (μm) | Hydrogen Gas Flow Rate (sccm) | Methane Gas Flow Rate (sccm) | Nitrogen Gas Flow Rate (sccm) | Ratio of Methane Gas to Hydrogen Gas (%) | Ratio of Nitrogen Gas to Methane Gas (%) | Pressure in Furnace (kPa) | Temperature of Substrate (° C.) | Concentration of Total Nitrogen Atoms (ppm) | Concentration of Isolated Substitutional Nitrogen Atoms (ppb) |
| 11 | 0.05 | 1000 | 150 | 0.3 | 15 | 0.2 | 18 | 1150 | 11 | 1040 |
| 12 | 0.2 | 1000 | 150 | 0.8 | 15 | 0.53 | 15 | 1150 | 47 | 560 |
| 13 | 0.08 | 1000 | 150 | 0.5 | 15 | 0.33 | 18 | 1180 | 5.4 | 790 |
| 14 | 0.5 | 1000 | 150 | 1.2 | 15 | 0.8 | 15 | 1100 | 68 | 380 |
| 15 | 0.06 | 1000 | 120 | 0.1 | 12 | 0.083 | 15 | 1150 | 0.9 | 180 |
| 16 | 0.5 | 1000 | 150 | 2 | 15 | 1.33 | 15 | 1100 | 95 | 125 |
| 17 | 0.03 | 1000 | 150 | 0.6 | 15 | 0.4 | 20 | 1180 | 12 | 4600 |
| 18 | 0.3 | 1000 | 150 | 1 | 15 | 0.67 | 15 | 1100 | 68 | 13.6 |
| 19 | 0.006 | 1000 | 150 | 1.1 | 15 | 0.73 | 15 | 1150 | 60 | 150 |
| 20 | 9.5 | 1000 | 150 | 1.5 | 15 | 1 | 15 | 1100 | 80 | 70 |
| 21 | 0.003 | 1000 | 120 | 0.05 | 12 | 0.042 | 15 | 1150 | 0.4 | 240 |
| 22 | 11 | 1000 | 150 | 5 | 15 | 3.3 | 15 | 1100 | 110 | 11 |

| Sample | Single Crystal Diamond | | | | After Annealing | |
|---|---|---|---|---|---|---|
| | Isolated Substitutional Nitrogen/Total Nitrogen (%) | Hardness (GPa) | Chipping Resistance (The Number of Chippings per 1 mm of Ridge Line) | | Chipping Resistance (The Number of Chippings per 1 mm of Ridge Line) | |
| | | | Size of Chipping Not Smaller Than 1 μm | Size of Chipping Not Smaller Than 10 μm | Size of Chipping Not Smaller Than 1 μm | Size of Chipping Not Smaller Than 10 μm |
| 11 | 9.45 | 118 | 0 | 0 | 0 | 0 |
| 12 | 1.19 | 101 | 0 | 0 | 0 | 0 |
| 13 | 14.63 | 118 | 1 | 0 | 0 | 0 |
| 14 | 0.56 | 95 | 1 | 0 | 0 | 0 |
| 15 | 20.00 | 119 | 2 | 0 | 0 | 0 |
| 16 | 0.13 | 82 | 2 | 0 | 0 | 0 |
| 17 | 38.33 | 110 | 7 | 0 | 2 | 0 |
| 18 | 0.02 | 98 | 8 | 1 | 2 | 0 |
| 19 | 0.25 | 100 | 2 | 0 | 1 | 0 |
| 20 | 0.09 | 80 | 5 | 1 | 2 | 0 |
| 21 | 60.00 | 125 | 10 | 3 | 6 | 2 |
| 22 | 0.01 | 70 | 30 | 3 | 20 | 2 |

(Results of Evaluation)

Samples 11 to 16 and 19 were single crystal diamonds fabricated with the substrates of which surface roughness (Ra) was not less than 0.006 μm and not more than 0.5 μm, in which a concentration of total nitrogen atoms was not lower than 0.9 ppm and not higher than 95 ppm and a concentration of isolated substitutional nitrogen atoms was not lower than 125 ppb and not higher than 1040 ppb. These single crystal diamonds had a hardness not lower than 82 GPa and not higher than 119 GPa. Regarding chipping resistance, the single crystal diamonds had at least 0 and at most 2 chippings having a length not smaller than 1 μm and 0 chipping having a length not smaller than 10 μM After annealing treatment at 1500° C., the single crystal diamonds had at least 0 and at most 1 chipping having a length not smaller than 1 μm.

Samples 17, 18, and 20 were single crystal diamonds fabricated with the substrates of which surface roughness (Ra) was not smaller than 0.03 μm and not more than 9.5 μm, in which a concentration of total nitrogen atoms was not lower than 12 ppm and not higher than 80 ppm and a concentration of isolated substitutional nitrogen atoms was not lower than 13.6 ppb and not higher than 4600 ppb. These single crystal diamonds had a hardness not lower than 80 GPa and not higher than 110 GPa. Regarding chipping resistance, the single crystal diamonds had at least 5 and at most 8 chippings having a length not smaller than 1 μm and at least 0 and at most 1 chipping having a length not smaller than 10 μm. After annealing treatment at 1500° C., the single crystal diamonds had 2 chippings having a length not smaller than 1 μm and 0 chipping having a length not smaller than 10 μm.

Samples 21 and 22 were single crystal diamonds fabricated with the substrates of which surface roughnesses (Ra) were 0.003 μm and 11 μm, in which concentrations of total nitrogen atoms were 0.4 ppm and 110 ppm and concentrations of isolated substitutional nitrogen atoms were 240 ppb and 11 ppb, respectively. These single crystal diamonds had hardnesses of 125 GPa and 70 GPa, respectively. Regarding chipping resistance, the single crystal diamonds had 10 and 30 chippings having a length not smaller than 1 μm and 3 and 3 chippings having a length not smaller than 10 μm, respectively. After annealing treatment at 1500° C., the single crystal diamonds had 6 and 20 chippings having a length not smaller than 1 μm and 2 and 2 chippings having a length not smaller than 10 μm, respectively.

Example 4

Samples 11 to 14 were applied to a main portion in contact with a work material of a cutting bite, a milling cutter wiper, an end mill, a drill, a reamer, a cutter, a dresser, a wire guide, a wiredrawing die, a waterjet nozzle, a diamond knife, a glass cutter, and a scriber, and compared with a tool to which a single crystal of type-Ib diamond synthesized with the conventional high pressure high temperature method was applied. It was found that each sample was smaller in amount of wear by 5% to at least 30% than the tool containing a single crystal of conventional diamond and was equal to or higher than such a tool in chipping resistance (at most one location where chipping occurred). Though the tool containing sample 21 out of the scope of the present invention was smaller in amount of wear by approximately 20% than the tool containing a single crystal of conventional diamond, chipping was likely (4 to 7 locations where chipping occurred).

It is considered based on results above that single crystal diamonds as samples 11 to 16 and 19 achieved improvement in hardness and chipping resistance in a balanced manner and would exhibit excellent wear resistance and chipping resistance when they were contained in a tool. Samples 17, 18, and 20 are considered as excellent as a material for a tool because they have such characteristics as improvement after annealing treatment, although they are slightly poor in chipping resistance. Samples 21 and 22 are considered as insufficient as a material for a tool.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

Single crystal diamond according to the present invention can be made use of in various products such as optical components, semiconductors, and electronic components, in addition to such tools as a cutting tool, a grinding tool, and a wear resistant tool.

The invention claimed is:

1. Synthetic single crystal diamond containing nitrogen atoms, in which a ratio of the number of isolated substitutional nitrogen atoms in the synthetic single crystal diamond to a total number of nitrogen atoms in the synthetic single crystal diamond is not lower than 0.02% and lower than 40%, wherein
the synthetic single crystal diamond has a Knoop hardness not lower than 80 GPa and not higher than 125 GPa in a <100> direction at a {100} plane.

2. The synthetic single crystal diamond according to claim 1, wherein
the ratio of the isolated substitutional nitrogen atoms in the synthetic single crystal diamond to the total number of nitrogen atoms in the synthetic single crystal diamond is not lower than 0.1% and not higher than 20%.

3. The synthetic single crystal diamond according to claim 1, wherein
a concentration of total nitrogen atoms in the synthetic single crystal diamond is not lower than 0.5 ppm and not higher than 100 ppm, and
a concentration of the isolated substitutional nitrogen atoms in the synthetic single crystal diamond is not lower than 10 ppb and not higher than 8 ppm.

4. The synthetic single crystal diamond according to claim 1, the synthetic single crystal diamond having at most two chippings having a size not smaller than 1 µm and zero chipping having a size not smaller than 10 µm, per 1 mm of a ridge line in working of an edge at a right angle.

5. The synthetic single crystal diamond according to claim 1, the synthetic single crystal diamond being obtained through annealing treatment in vacuum not lower than 1300° C.

6. A method for manufacturing the synthetic single crystal diamond according to claim 1 with chemical vapor deposition, the method comprising:
preparing a substrate having surface roughness (Ra) of a main surface not less than 0.05 µm and not more than 10 µm; and
growing synthetic single crystal diamond on the substrate, in a vapor phase in growing synthetic single crystal diamond, a ratio of a concentration of a methane gas to a concentration of a hydrogen gas being not lower than 7% and not higher than 30% and a ratio of a concentration of a nitrogen gas to a concentration of the methane gas being not lower than 0.02% and not higher than 10%.

7. The method for manufacturing the synthetic single crystal diamond according to claim 6, wherein
the substrate has the main surface having an off angle with respect to a {001} plane not smaller than 0° and not greater than 15°.

8. The method for manufacturing the synthetic single crystal diamond according to claim 6, wherein
the main surface of the substrate includes grooves in parallel to at least any of a ±[100] direction and a ±[010] direction with respect to a (001) plane.

9. A tool containing the synthetic single crystal diamond according to claim 1 in a portion of contact with a work material, the tool being selected from the group consisting of a cutting bite, a milling cutter wiper, an end mill, a drill, a reamer, a cutter, a dresser, a wire guide, a wiredrawing die, a waterjet nozzle, a diamond knife, a glass cutter, and a scriber.

10. CVD single crystal diamond containing nitrogen atoms, in which a ratio of the number of isolated substitutional nitrogen atoms in the CVD single crystal diamond to a total number of nitrogen atoms in the CVD single crystal diamond is not lower than 0.02% and lower than 40%, wherein
the CVD single crystal diamond has a Knoop hardness not lower than 80 GPa and not higher than 125 GPa in a <100> direction at a {100} plane.

11. A method for manufacturing the synthetic single crystal diamond according to claim 1 with chemical vapor deposition, the method comprising:
preparing a substrate having surface roughness (Ra) of a main surface not less than 0.006 µm and not more than 10 µm; and
growing synthetic single crystal diamond on the substrate, in a vapor phase in growing synthetic single crystal diamond, a ratio of a concentration of a methane gas to a concentration of a hydrogen gas being not lower than 7% and not higher than 30% and a ratio of a concentration of a nitrogen gas to a concentration of the methane gas being not lower than 0.02% and not higher than 10%, wherein
the synthetic single crystal diamond is obtained through annealing treatment in vacuum not lower than 1300° C.

* * * * *